(12) United States Patent
Kentaroh et al.

(10) Patent No.: US 8,578,391 B2
(45) Date of Patent: Nov. 5, 2013

(54) SYSTEM AND INTERFACE FOR CONTROLLING DEVICES

(75) Inventors: Sugiyama Kentaroh, Kanagawa (JP); Satoru Nakamura, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 1192 days.

(21) Appl. No.: 12/233,033

(22) Filed: Sep. 18, 2008

(65) Prior Publication Data

US 2009/0119683 A1    May 7, 2009

(30) Foreign Application Priority Data

Nov. 5, 2007 (JP) ................................ 2007-287865

(51) Int. Cl.
     *G06F 3/00*      (2006.01)
     *G06F 1/00*      (2006.01)

(52) U.S. Cl.
     USPC ......................................... 719/310; 713/300

(58) Field of Classification Search
     USPC ......................................... 719/310; 713/300
     See application file for complete search history.

(56) References Cited

U.S. PATENT DOCUMENTS

| 7,554,758 | B2 * | 6/2009 | Hakamata et al. | ............... 360/69 |
| 2005/0096797 | A1 * | 5/2005 | Matsubara et al. | ........... 700/291 |
| 2006/0045107 | A1 * | 3/2006 | Kucenas et al. | ............... 370/401 |
| 2006/0206734 | A1 * | 9/2006 | Hori | ............................... 713/300 |
| 2008/0048861 | A1 * | 2/2008 | Naidoo et al. | ................ 340/541 |
| 2009/0012633 | A1 * | 1/2009 | Liu et al. | .......................... 700/90 |
| 2009/0293518 | A1 * | 12/2009 | Bettella | ........................... 62/186 |

FOREIGN PATENT DOCUMENTS

| JP | 10-98778 | 4/1989 |
| JP | 2003-120992 A | 4/2003 |
| JP | 2006-64254 A | 3/2006 |

OTHER PUBLICATIONS

Ricardo, Power and energy Management for Server Systems, Nov. 2004.*
Mio Motomura, Information Materials for IDS, JPO Office Action Dated Feb. 21, 2012, 2 pages.

* cited by examiner

*Primary Examiner* — Lechi Truong
(74) *Attorney, Agent, or Firm* — Andrea Bauer; Hoffman Warnick LLC

(57) ABSTRACT

A group of IT devices is divided into zones according to a predetermined condition. An IT managing server that manages the group of IT devices sends a control request for changing the state of IT devices included in one of the zones according to the state of those IT devices under its management. The control request specifies the zone as a control target. A facility managing server that manages a group of facility devices receives the control request and controls a facility device that exerts effect on the zone, which is specified as the control target in the control request.

3 Claims, 7 Drawing Sheets

SYSTEM AND INTERFACE FOR CONTROLLING DEVICES

FIELD OF THE INVENTION

The present invention relates to a system and an interface for controlling and associating IT devices and facility devices with each other at the place (room) where the IT devices are set.

BACKGROUND ART

At a place such as a data center where a group of many IT devices are set, the environment needs to be kept suitable for the IT devices to operate therein and so-called facility devices including air-conditioners and power supply units are controlled for that purpose. Specifically, an air-conditioner is adjusted to sufficiently cool the IT devices or power is stably supplied to the IT devices. That ensures the stable operation for the IT devices.

The facility devices can include various devices such as an air-conditioner, a power supply unit, a lighting fixture, etc. For efficient management and control of facility devices, control systems have been developed (for example, see Published Unexamined Patent Application No. 10-98778). This reference discloses a building managing system for integrally controlling various facility devices in a building.

As mentioned above, it is important that the facility devices should be suitably controlled in such a place as a data center where many IT devices are set and required to provide stable operation. In case of a system that manages and controls such IT devices and facility devices separately, it is difficult to provide suitable and efficient control for the facility devices. When the system controls an air-conditioner, for example, it tends to cause the air-conditioner to provide too much cool air for the purpose of preventing a server device that keeps operating from heating up to run away or halt. Although the server device should obviously neither run away nor halt, it is inefficient to control the facility devices to provide too much cool air, because such control leads to an unnecessary increase in energy consumption.

On the other hand, a technique has been developed to associate a managing system for a group of IT devices (IT managing system) and a managing system for facility devices (facility managing system) with each other to efficiently control the facility devices. As mentioned above, however, various types of devices are used as the facility device and various types of management are provided by the facility managing system. In addition, there is a quite complicated influential relationship between the respective facility devices and the respective IT devices. For those reasons, it is difficult to associate the IT managing system and the facility managing system each other.

SUMMARY OF THE INVENTION

The present invention relates to a system and an interface for controlling and associating IT devices and facility devices with each other at the place (room) where the IT devices are set.

One aspect of the present invention provides a system, comprising: a first managing server for managing a group of first devices and sending a control request for changing a state of a first device according to the state of the first device under its management, wherein the group of first devices is divided into zones according to a predetermined condition, the first device is present in one of the zones, and the control request specifies the zone as a control target; and a second managing server for managing a group of second devices, receiving the control request, and controlling a second device that exerts effect on the zone, which is specified as the control target in the control request.

Another aspect of the present invention provides a system comprising a first managing server for managing a group of first devices and a second managing server for managing a group of second devices. The second managing server sends a control request for changing the state of a first device according to the state of the second device under its management, wherein the group of first devices is divided into zones according to a predetermined condition, the first device is present in one of the zones, and the control request specifies the zone as a control target. The first managing server receives the control request and controls a first device that is present in the zone, wherein the zone is specified as the control target in the control request.

Another aspect of the present invention provides an interface, comprising: a first interface for obtaining a control request generated by a first managing server that manages a group of first devices, and sending the control request; and a second interface for receiving the control request and passing the control request to a second managing server that manages a group of second devices. The first interface comprises: a first storing unit that stores correspondence information indicating correspondence between each of the first devices of the group of first devices and a zone, wherein the group of first devices is divided into the zones according to a predetermined condition; and a first converter for converting the control request into a control request which specifies the zone as a control target, based on the correspondence information stored in the first storing unit. The second interface comprises: a second storing unit that stores correspondence information indicating correspondence between each of the second devices of the group of second devices and the zone; and a second converter for converting the control request that is converted by the first converter of the first interface into a control request that specifies the second device as a control target, wherein the second device exerts effect on the zone that is specified as the control target in the control request.

Another aspect of the present invention is directed to an interface, comprising: a first interface for receiving a control request for a group of first devices and passing the control request to a first managing server that manages the group of first devices; and a second interface for obtaining the control request for the group of first devices generated by a second managing server that manages a group of second devices, and sending the control request to the first interface. The second interface comprises: a storing unit that stores correspondence information indicating correspondence between each of the second devices of the group of second devices and a zone, wherein the group of first devices is divided into the zones according to a predetermined condition; and a converter for converting the control request into a control request which specifies the zone as a control target, based on the correspondence information stored in the storing unit. The first interface comprises: a storing unit that stores correspondence information indicating correspondence between each of the first devices of the group of first devices and the zone; and a converter for converting the control request that is converted by the converter of the second interface into a control request that specifies a first device as a control target, wherein the first device is present in the zone that is specified as a control target in the control request, based on the correspondence information stored in the storing unit in the first interface part.

According to the present invention with the above-mentioned configuration, an IT managing system and a facility managing system are associated with each other so that suitable and efficient control on operation of IT devices and facility devices is realized.

The present invention also provides an interface for associating an IT managing system and a facility managing system with each other.

BRIEF DESCRIPTION OF THE DRAWINGS

Embodiments of the present invention will be described in detail with reference to the attached drawings.

DETAILED DESCRIPTION OF THE INVENTION

Figure 1:
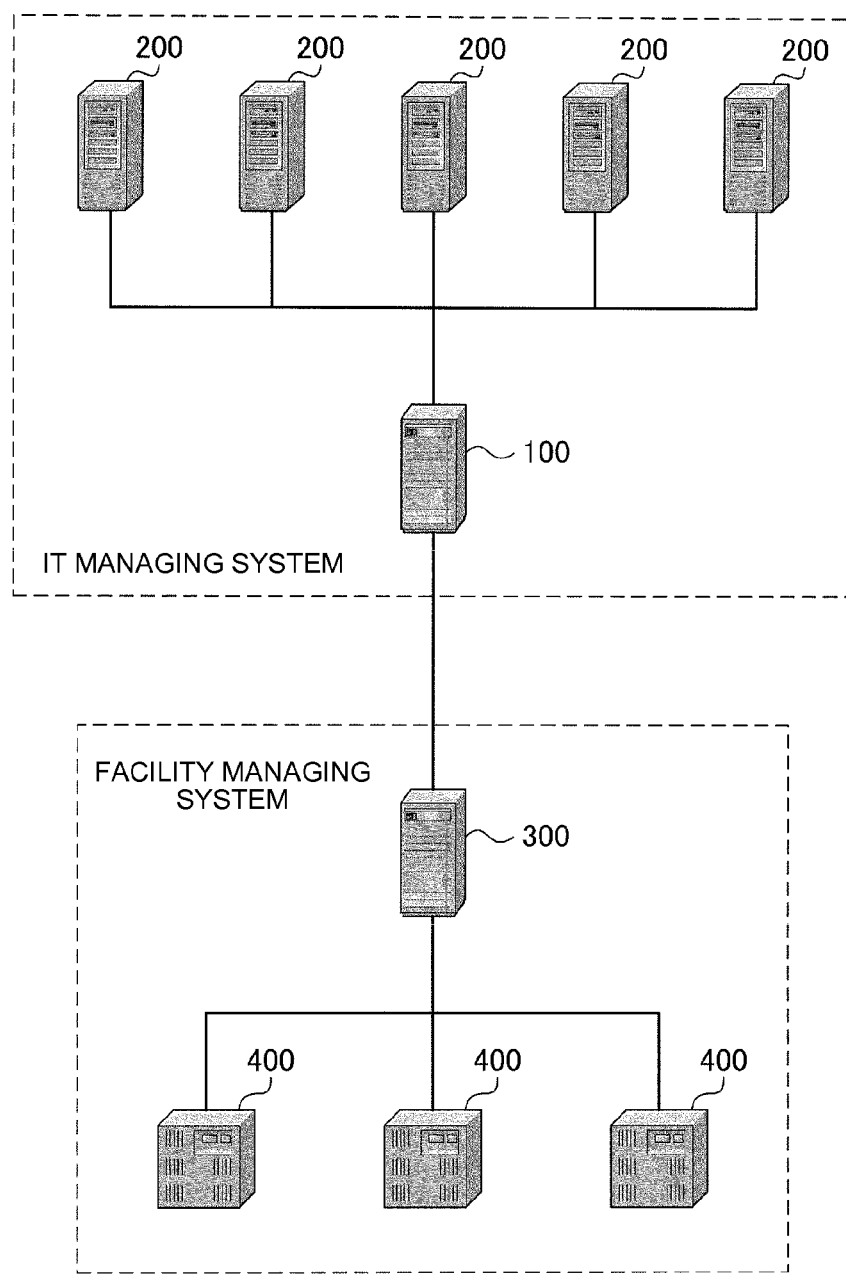
FIG. 1 is a diagram showing an illustrative configuration of an IT managing system and a facility managing system to which an embodiment of the present invention is applied.

FIG. 1 is a diagram showing an illustrative configuration of an IT managing system and a facility managing system to which an embodiment of the present invention is applied.

As shown in FIG. 1, the system according to the embodiment includes an IT managing server 100 for managing an IT device 200, and a facility managing server 300 for managing a facility device 400. The IT managing server 100 manages a plurality of IT devices 200 (various types of servers and the like). The IT managing server 100 is connected with each of the IT devices 200 via existing various types of Local Area Networks (LANs). The facility managing server 300 manages a plurality of facility devices 400. The facility managing server 300 is connected with each of the facility devices 400 via existing various types of building automation facility networks, for example, Building Automation and Control Network (BACnet). For simplicity, FIG. 1 describes that only a unit of facility managing server 300 manages various facility devices 400. In actual cases, however, the facility managing servers 300 may be provided for respective types of facility devices 400 and connected with the IT managing servers 100.

Figure 2:
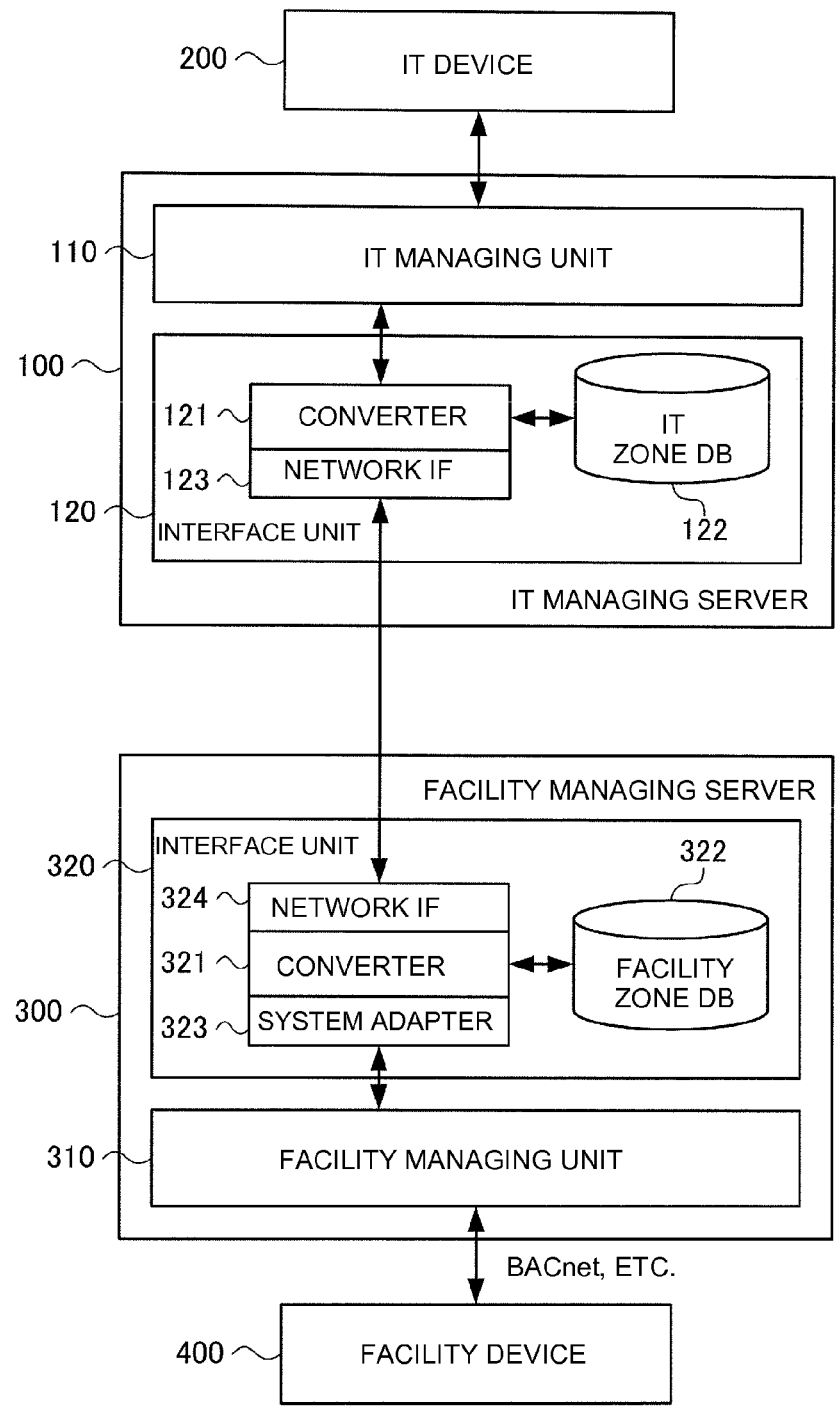
FIG. 2 is a diagram showing an illustrative functional configuration of an associating system according to an embodiment of the present invention.

FIG. 2 is a diagram showing a functional configuration of an associating system according to an embodiment.

The associating system includes an interface on the IT managing system side and an interface on the facility managing system side. In the exemplary configuration shown in FIG. 2, the IT managing server 100 and the facility managing server 300 are provided with interfacing functions.

In FIG. 2, the IT managing server 100 includes an IT managing unit 110 for managing and controlling the IT device 200 and an interface unit 120.

The IT managing unit 110, which has a function corresponding to an existing IT managing server, manages the state of the IT device 200 connected thereto and controls its operation. The IT managing unit 110 issues a control request to the facility managing server 300 according to the state of the IT device 200.

The interface unit 120 includes a converter 121, an IT zone database (DB) 122, and a network interface (IF) 123. The interface unit 120 converts the control request received from the IT managing unit 110 using the converter 121 and sends the request to the facility managing server 300 through the network IF 123. The interface unit 120 also converts a control request received from the facility managing server 300 through the network IF 123 using the converter 121 and passes the request to the IT managing unit 110. The IT zone DB 122 stores information on a zone used for converting the control request at the converter 121. The zone will be described later.

In FIG. 2, the facility managing server 300 includes a facility managing unit 310 for managing and controlling the facility device 400 and an interface unit 320.

The facility managing unit 310, which has a function corresponding to an existing facility managing server, manages the facility device 400 connected thereto and controls its operation. The facility managing unit 310 issues a control request to the IT managing server 100 if required.

The interface unit 320 includes a converter 321, a facility zone database (DB) 322, a system adapter 323, and a network interface (IF) 324. The interface unit 320 converts the control request received from the facility managing unit 310 via the system adapter 323 using the converter 321 and sends the request to the IT managing server 100 through the network IF 324. The interface unit 320 also converts a control request received from the IT managing server 100 through the network IF 324 using the converter 321 and passes the request to the facility managing server 300 via the system adapter 323. As the facility managing server 300 has different I/O interfaces corresponding to the types of facility devices 400, the system adapter 323 converts the I/O interfaces as required. The facility zone DB 322 stores information on a zone used for converting the control request at the converter 321. The zone will be described later.

Figure 3:
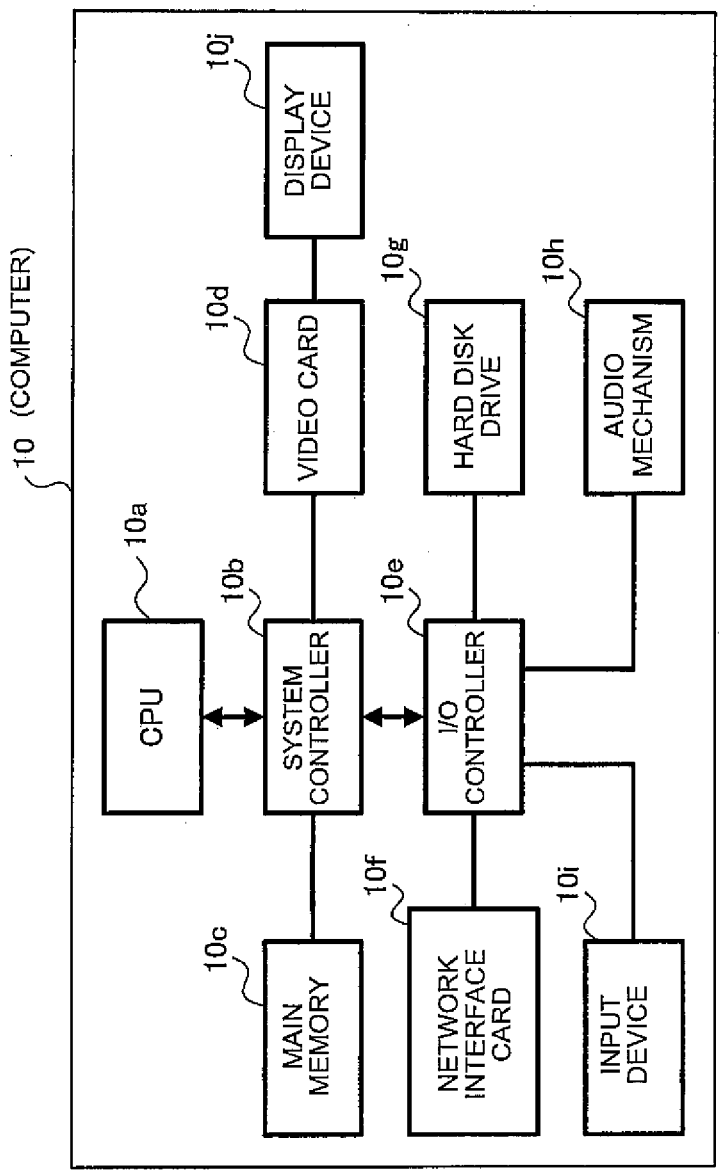
FIG. 3 is a diagram showing an example of hardware configuration of the IT managing server and the facility managing server in accordance with an embodiment of the present invention.

FIG. 3 is a diagram showing an example of hardware configuration of the IT managing server 100 and the facility managing server 300.

A computer 10 shown in FIG. 3 includes a Central Processing Unit (CPU) 10a, which is calculating means, and main memory 10c and a Hard Disk Drive (HDD) 10g, which are storing means. The computer 10 also includes a network interface card 10f for connecting the computer 10 with an external device via a network, a video card 10d and a display 10j for displaying and outputting, and an audio mechanism 10h for outputting sound. The computer 10 further includes input devices 10i including a keyboard and a mouse.

As shown in FIG. 3, the main memory 10c and the video card 10d are connected with the CPU 10a via a system controller 10b. The network interface card 10f, the HDD 10g, the audio mechanism 10h and the input devices 10i are connected with the system controller 10b via an I/O controller 10e. The components are connected with one another via various types of busses such as a system bus and an I/O bus. For example, the CPU 10a and the main memory 10c are connected by the system bus or the memory bus. The CPU 10a and the components including the HDD 10g, the network interface card 10*f*, the video card 10*d*, the audio mechanism 10*h* and the input devices 10*i* are connected by such I/O busses as Peripheral Components Interconnect (PCI), PCI Express, serial ATA (AT Attachment), Universal Serial Bus (USB), Accelerated Graphics Port (AGP) and the like.

It is needless to say that FIG. 3 merely exemplifies a hardware configuration of a PC to which an embodiment is applied, and the present invention is not limited to the configuration shown. The embodiment may include only a video memory instead of having the video card 10*d* so that image data is processed by the CPU 10*a*. The audio mechanism 10*h* needs not to be included separately and may be included as a function of a chip set that forms the system controller 10*b* or the I/O controller 10*e*. As auxiliary storage, drives that are for various media including an optical disk or a flexible disk may be provided therein as well as HDD 10*g*. Although a liquid crystal display is mainly used as a display 10*j*, though, any type of displays including a CRT display and a plasma display may be used.

In the embodiment, a concept 'zone' is used to indicate a unit for identifying the facility device 400 and the IT device 200 which are to be controlled.

A plurality of IT devices 200 are set in a data center. For that reason, it is not easy to control the respective IT devices 200 to cause the facility devices 400 to exert their effects. It is also not easy to identify each of the facility devices 400 to cause a particular IT device 200 to exert a desired effect thereon and to control the operation. Then, a certain range called as zone is considered here as a unit for controlling the facility devices 400 that exert their effects on the zone.

The zone is a range of the facility devices 400 to exert a certain effect on the IT devices 200. The range of a zone depends on arrangement of the IT devices 200, arrangement and performance of the facility devices 400, connection relation between the IT devices 200 and the facility devices 400, and the like. Therefore, the zone is principally set for each type of facility devices 400. Specifically, when the facility devices 400 are air-conditioners, a zone is determined as a range of the respective air-conditioners to be controlled to adjust the temperature. When the facility devices 400 are power supply units, a zone is determined as a range for each of the power supply units 400 to control the power supply, i.e., a group of IT devices 200 connected with the respective power supply units.

An IT zone DB 122 (FIG. 1) is provided for the interface unit 120 of the IT managing server 100 and stores information on the correspondence between the zones and the IT devices 200 managed by the IT managing server 100 included in the zones. As mentioned above, the zone is set for each type of the facility devices 400. Therefore, the correspondence between the IT devices 200 and the zones is also set for each type of the facility devices 400.

A facility zone DB 322 is provided for the interface unit 320 of the facility managing server 300 and stores information on the correspondence between the zones and the facility devices 400 which are set for the facility devices 400 managed by the facility managing server 300. As will be described later, the correspondence between the facility device 400 and zone depends on the type of the facility device 400; multiple facility devices 400 may correspond to a zone or a facility device 400 may correspond to multiple zones.

Figure 4:
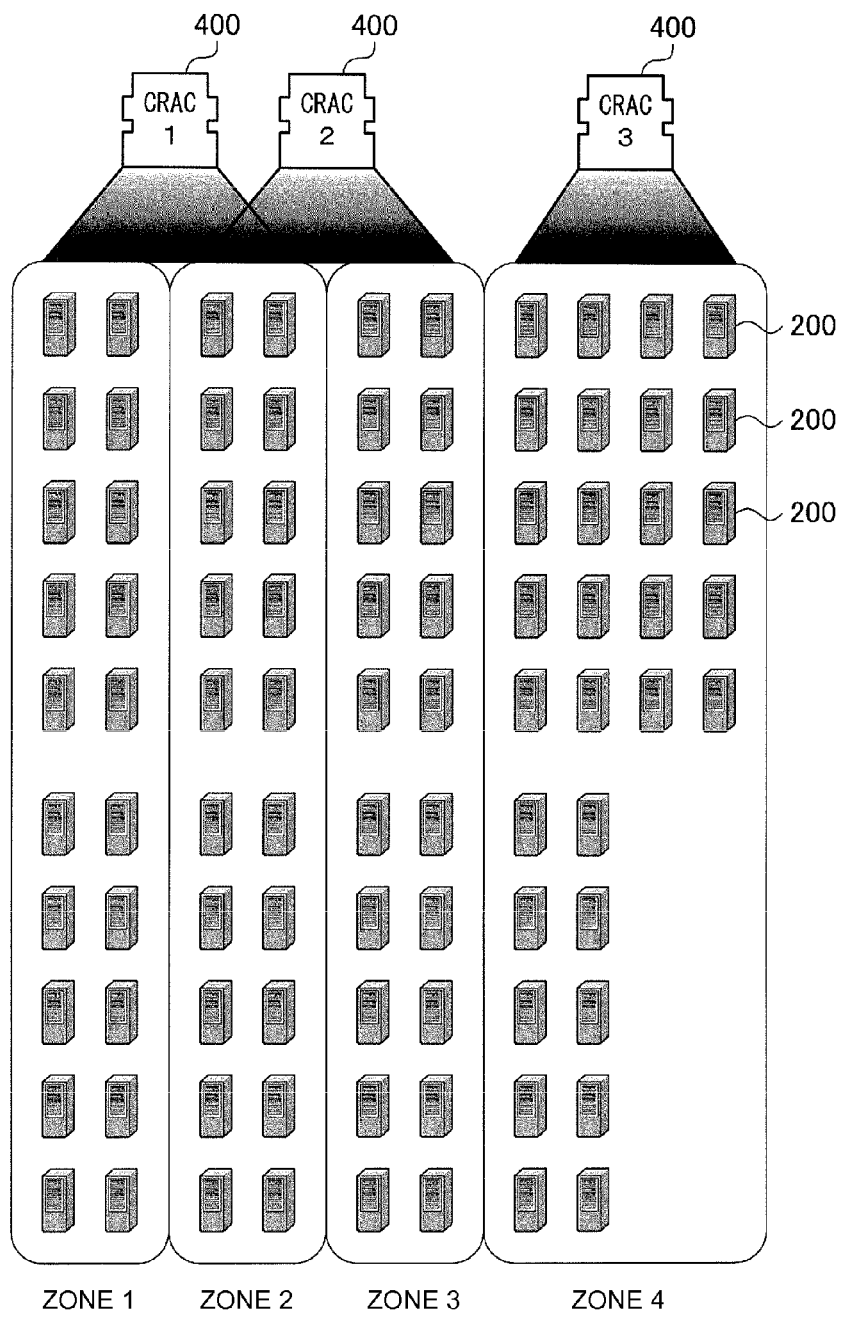
FIG. 4 is a diagram showing an example of a zone where a facility device is an air-conditioner in accordance with an embodiment of the present invention.

FIG. 4 is a diagram showing an example of a zone where the facility device 400 is an air-conditioner.

In FIG. 4, a group of IT devices 200 is divided into four zones; from a zone 1 to a zone 4. Three computer Room Air Conditioners (CRAC) which are facility devices 400 from a CRAC 1 to a CRAC 4 are set. The zone 1 is cooled by the CRAC 1. The zone 2 is cooled by the CRAC 1 and the CRAC 2. The zone 3 is cooled by the CRAC 2. The zone 4 is cooled by the CRAC 3. If the IT devices 200 included in the zone 1 are to be cooled, for example, the CRAC 1 is controlled to supply much cooler air.

In the example shown in FIG. 4, the zone 1 is subject to the effect of only the CRAC 1, the zone 3 is subject to the effect of only the CRAC 2, and the zone 2 is subject to the effect of both of the CRAC 1 and the CRAC 2. That is because the zone 2 is set as a zone independent of the zone 1 and the zone 3. As such, for some types of the facility devices 400, the zone and the facility device 400 do not necessarily correspond to each other one by one.

Figure 5:
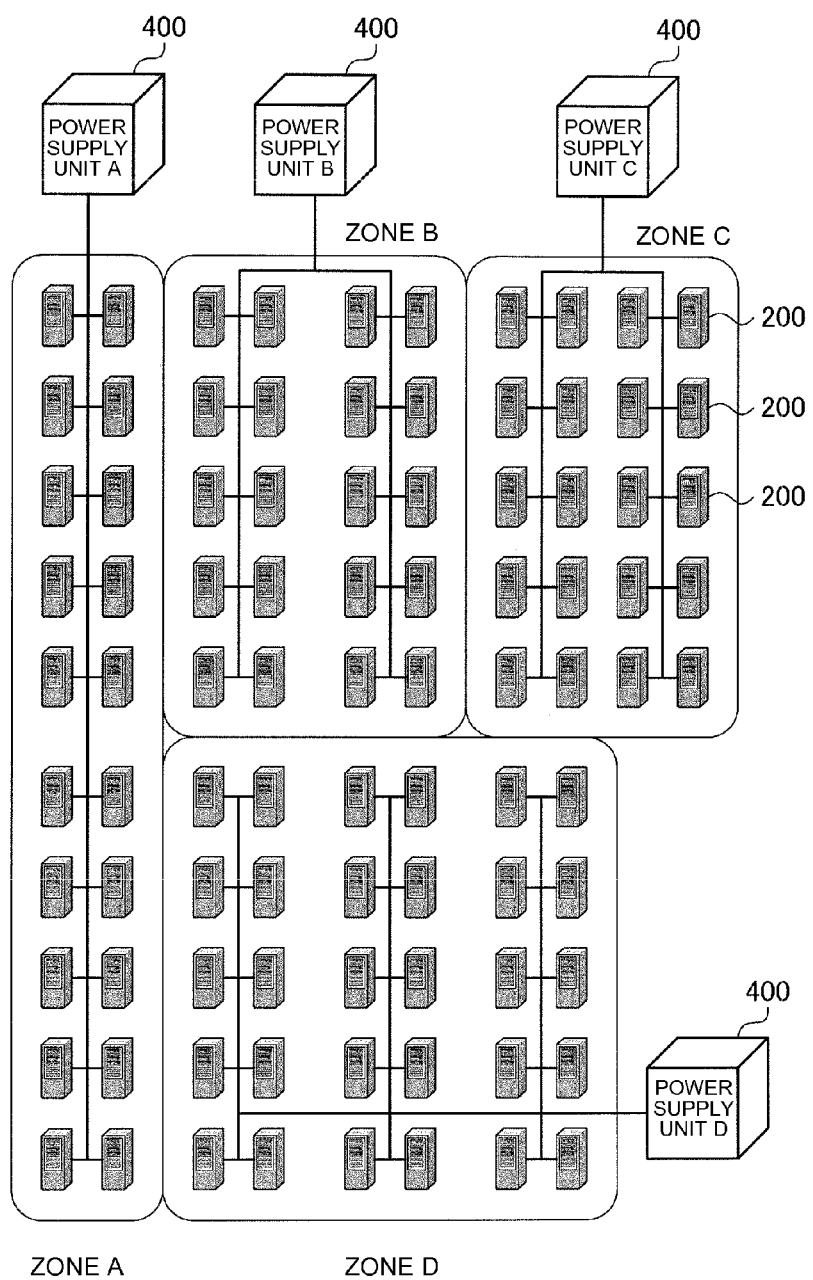
FIG. 5 is a diagram showing an example of a zone where the facility device is a power supply unit in accordance with an embodiment of the present invention.

FIG. 5 is a diagram showing an example of a zone where the facility device 400 is a power supply unit.

In FIG. 5, a group of IT devices 200 is divided into four zones; from a zone A to a zone D. Four power supply units from a power supply unit A to a power supply unit D, which are facility devices 400, are set. The IT devices 200 and the power supply unit included in each zone are physically connected by power lines. Accordingly, when the facility device 400 is a power supply unit, the zone and the facility device 400 correspond to each other one by one.

The transferring of a control request between the IT managing server 100 and the facility managing server 300 will now be described.

First, operations performed when a control request is issued from the IT managing server 100 to the facility managing server 300 will be described. As a specific example, the case where the facility devices 400 shown in FIG. 4 are air-conditioners which are to be controlled to provide air-conditioning for a predetermined IT device 200 will be described.

It is assumed that the predetermined IT device 200 needs to be cooled for air-conditioning itself. The IT device 200 uses a sensor mounted thereto to obtain a temperature inside itself and the like and reports them to the IT managing server 100. In response to the report, the IT managing unit 110 of the IT managing server 100 generates a control request for cooling the IT device 200 and sends out the control request to the interface unit 120. The IT device 200 to be cooled is identified by the ID (serial number and the like). Each IT device 200 is given an ID.

The converter 121 of the interface unit 120 receives the control request sent out from the IT managing unit 110, refers to the IT zone DB 122, and identifies the zone that includes the IT device 200 to be cooled. The IT zone DB 122 stores information on zones set for respective types of the facility devices 400. The converter 121 selects a piece of information with regard to the zones set in consideration with the air-conditioners and the IT devices 200 from the information stored in the IT zone DB 122, and identifies the desired zone.

After identifying the zone, the converter 121 converts the control request into a control request for the identified zone. Specifically, the converter 121 converts the request to cool the predetermined IT device 200 into a request to cool the zone that includes the IT device 200. The converted control request is sent to the facility managing server 300 via the network IF 123.

Figure 6:
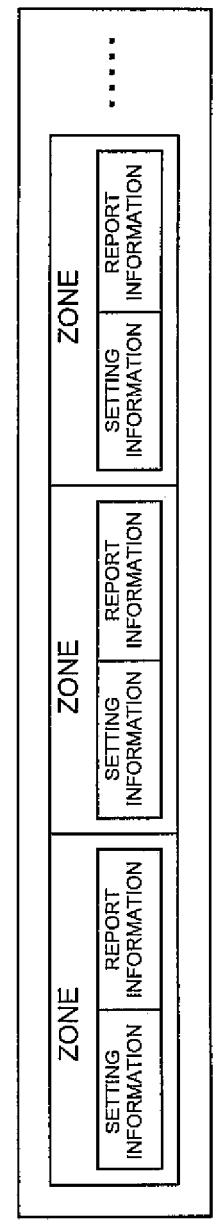
FIG. 6 is a diagram showing an example of a data structure of a control request that is converted into a request for a zone in accordance with an embodiment of the present invention.

FIG. 6 is a diagram showing an example of a data structure of the control request that is converted into a request for a zone.

In the example shown in FIG. 6, each zone records setting information (set temperature in the example) and report information for the zone. The report information includes a message indicating that the setting has been converted and a warning of emergency.

The method for transferring the control request is not limited in particular. The IT managing server 100 leads in sending the control request to the facility managing server 300 (PUSH style) or the facility managing server 300 inquires the IT managing server 100 for a control request at regular intervals or appropriate intervals and obtains the request if there is any request (PULL style). The setting information and the report information which form the control request may be separately sent from the IT managing server 100 to the facility managing server 300. Alternatively, the facility managing server 300 may read the request from the IT managing server 100.

The interface unit 320 of the facility managing server 300 receives the control request sent from the IT managing server 100 in the above-mentioned manner via the network IF 324. The converter 321 of the interface unit 320 refers to the facility zone DB 322 and identifies the facility device 400 corresponding to (exerting an effect on) the zone specified in the control request. It identifies the facility device 400 by using the BACnet object ID in the BACnet, for example. Here, an air-conditioner that exerts an effect on (i.e., that can cool) the IT devices 200 included in the zone is identified.

After identifying the facility device 400, the converter 321 converts the control request into a control request to the identified facility device 400. Then, the converter passes the converted control request to the facility managing unit 310 via the system adapter 323. The facility managing unit 310 controls operation of the facility device 400 based on the received control request. Here, adjustment is performed on the quantity and/or the temperature of air supplied by a fan of the air-conditioner identified by the control request.

Then, the air-conditioner(s) that can cool a certain range including the IT device 200 that needs to be cooled (the zone) is controlled and the IT device 200 is cooled. As mentioned above, as multiple facility devices 400 may be present for exerting effects on the predetermined zone, multiple facility devices 400 may be identified by the control request converted by the converter 321. In such a case, specific control is performed on each of the facility devices 400 by a control function intrinsic to the facility managing unit 310. Flexible control can be taken as required such as lowering the set temperatures for respective air-conditioners on the average, or if the temperature has been set for a particular air-conditioner lower than the other air-conditioners, lowering only the set temperatures for the other air-conditioners.

Now, operation taken when the facility managing server 300 issues a control request to the IT managing server 100 will be described. Specifically, it is assumed that the facility devices 40 are power supply units and the amounts of power supplied to the IT devices 200 are controlled as shown in FIG. 5. When something such as 'power down' happens to a power supply unit and the amount of power supplied from the unit needs to be restricted, the facility managing server 300 may request the IT managing server 100 to reduce the power consumption. The case where the facility devices 400 are power supply units will be described as an example below.

It is assumed that a predetermined power supply unit causes a need to restrict the power consumption. When the facility managing unit 310 of the facility managing server unit 300 detects the power supply unit (hereinafter, referred to as a target power supply unit), it generates a control request to reduce the power consumption of the IT devices 200 so as to address the lowered amount of power supply from the target power supply unit, and sends out the control request to the interface unit 320. Here, the power supply units are physically connected to the IT devices 200. Although the power consumption of the group of IT devices 200 that is supplied with power from the detected target power supply unit is to be reduced, the facility managing unit 310 does not specifically recognize which power supply unit supplies power to which IT device 200. Then, the facility managing unit 310 generates a control request in which the target power supply unit whose power supply needs to be reduced is identified.

The converter 321 of the interface unit 320 receives the control request sent out from the facility managing unit 310 via the system adapter 323, refers to the facility zone DB 322, and identifies the zone corresponds to the target power supply unit. Then, the converter 321 converts the received control request into a control request for the identified zone. Specifically, the converter 321 converts the received request in which the target power supply unit is identified to a request to reduce the power consumption for the zone to which the target power supply unit supplies power. The data structure of the converted control request is the same as that in the example shown in FIG. 6. The converted control request is sent to the IT managing server 100 through the network IF 324.

The interface unit 120 of the IT managing server 100 receives the control request that is sent from the facility managing server 300 in the above-mentioned manner through network IF 123. The converter 121 of the interface unit 120 refers to the IT zone DB 122 and identifies the IT device 200 included in the zone specified by the control request. Here, the IT device 200 that is supplied with power from the target power supply unit is identified.

After identifying the IT device 200, the converter 121 converts the control request into a control request for the identified IT device 200. Then, the converter 121 sends the converted control request to the IT managing unit 110. The IT managing unit 110 controls operation of the IT device 200 based on the received control request. Specifically, the IT managing unit 110 changes an operation mode of the IT device 200 or disconnects some IT devices 200 in the zone from their power source so as to meet the power consumption asked by the control request. Some types of IT device are ready for an operation mode that allows lower power consumption to the device (power saving mode) with the throughput of the device lowered or the functions restricted. Such types of IT device 200 can contribute to reduce the power consumption according to the control request by changing the operation mode. In some cases, depending on an embodiment for use, some IT devices 200 of a group of IT devices 200 may never be used, or may make no difference if they are not used. In such a system, some IT devices 200 can be disconnected from the power source under the management of the IT managing unit 110 so as to contribute to reduce the power consumption according to the control request.

Transferring of a control request has been described for the cases where a control request is issued from the IT managing server 100 to the facility managing server 300 and where a control request is issued from the facility managing server 300 to the IT managing server 100 by exemplifying the cases where the facility devices 400 are air-conditioners and power supply units. It is a matter of course, however, that the present invention is not limited to the specific system configuration and exemplary operation.

As mentioned above, it is not easy for the IT managing server 100 or the facility managing server 300 to recognize which facility device 400 exerts what kind of effect on which IT device 200. The embodiment is for providing an interface for associating a managing system using the IT managing server 100 and a managing system using the facility managing server 300 without limiting the type of the facility devices 400.

The zone adopted in the embodiment identifies a range of IT devices in a group of IT devices 200 that is subject to certain effect of a function of the facility device 400. It is apparent from the examples of the above-mentioned air-conditioners or power supply units that a range set for a zone depends on the type of the facility device 400. As information on the IT devices 200 corresponding to each zone is used only at the IT managing system side and information on the facility devices 400 corresponding to each zone is used only at the facility managing system side, this kind of information needs to be managed only in respective systems. Actual control of the facility devices 400 and the IT devices 200 to meet a control request is left to the facility managing unit 310 corresponding to an existing facility managing server and the IT managing unit 110 corresponding to an existing IT managing server, respectively. In the embodiment, if a zone is set based on relationship between the IT device 200 and the facility device 400 and correspondence between the IT device 200 or the facility device 400 and the zone is determined, the managing system of various facility devices 400 and the IT managing system can be arbitrarily associated with each other. The correspondence between the IT device 200 or the facility device 400 and the zone only needs to be stored in the above-mentioned database (IT zone DB 122 and facility zone DB 322) or the other data storage.

The embodiment is adapted to have the IT managing server 100 provided with the IT managing unit 110 corresponding to an existing IT managing server and the interface unit 120; and the facility managing server 300 provided with the facility managing unit 310 corresponding to an existing facility managing server and the interface unit 320. The present invention is not limited to the hardware configuration and may have any configuration to realize the technical idea of the present invention. For example, the IT managing server and the facility managing server may be existing servers and a server with a function of the interface unit 120 of the embodiment and a server with a function of the interface unit 320 may be involved between them.

Figure 7:
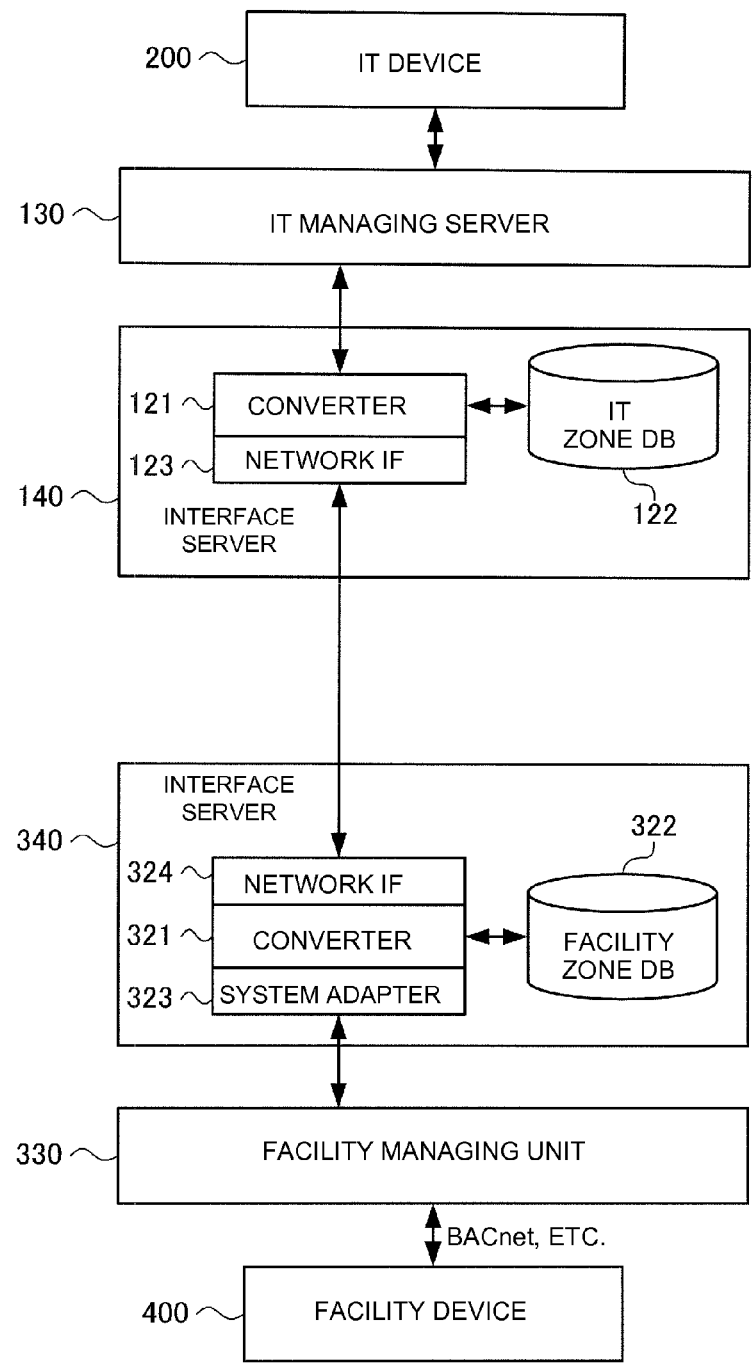
FIG. 7 is a diagram showing a functional configuration of an associating system according to another embodiment of the present invention.

FIG. 7 is a diagram showing an example of system configuration in which an interface server is separately provided.

In FIG. 7, an IT managing server 130 corresponds to the IT managing unit 110 of the IT managing server 100 in the configuration of FIG. 2. An interface server 140 corresponds to the interface unit 120 in the configuration of FIG. 2. The same reference numerals as those of the functions of the interface unit 120 shown in FIG. 2 are given to functions of the interface server 140, which will be omitted from the description. Any interface may be used between the IT managing server 130 and the interface server 140 without any limitation. A facility managing server 330 corresponds to the facility managing unit 310 of the facility managing server 300 in the configuration of FIG. 2. An interface server 340 corresponds to the interface unit 320 in the configuration of FIG. 2. The same reference numerals as those of the functions of the interface unit 320 in FIG. 2 are given to functions of the interface server 340, which will be omitted from the description. Although an interface between the facility managing server 330 and the interface server 340 is usually defined by the facility managing server 330, the interface is not limited to that.

The foregoing description of the embodiments of this invention has been presented for purposes of illustration and description. It is not intended to be exhaustive or to limit the invention to the precise form disclosed, and obviously, many modifications and variations are possible.

The invention claimed is:

1. A system comprising:
a first managing server for managing a group of computing devices and for sending a control request for changing a temperature state of a selected computing device in the group of computing devices, wherein the group of computing devices is divided into a plurality of zones according to a predetermined condition, and wherein the selected computing device is located in one of the plurality of zones; and
a second managing server for managing a group of air-conditioners, for receiving the control request, and for controlling an identified air-conditioner in the group of air-conditioners that exerts a temperature changing effect on the zone in which the selected computing device is located;
wherein the first managing server comprises:
a first managing unit for generating a control request specifying the selected computing device as a control target, according to a temperature state of each of the computing devices;
a first storing unit for storing correspondence information indicating a correspondence between each computing device and the plurality of zones, the correspondence information for each computing device indicating the zone in which the computing device is located; and
a first converter for converting the control request into zone information identifying the zone in which the selected computing device is located, based on the correspondence information stored in the first storing unit; and
wherein the second managing server comprises:
a second storing unit for storing correspondence information indicating a correspondence between each zone and the group of air-conditioners, the correspondence information for each zone indicating the air-conditioner that exerts a temperature changing effect on the zone;
a second converter for converting the zone information provided by the first converter into information identifying the air-conditioner in the group of air conditioners that has a temperature changing effect on the zone identified by the zone information, based on the correspondence information stored in the second storing unit; and
a second managing unit for controlling the identified air conditioner to change a temperature state of the selected computing device.

2. The system according to claim 1, wherein the second managing server sends a control request to the first managing server for changing an operational state of the selected computing device, according to a state of the identified air-conditioner under its management, and wherein the first managing server receives the control request and controls the selected computing device.

3. A system comprising:
a first managing server for managing a group of computing devices and for sending a control request for changing a power state of a selected computing device in the group of computing devices, wherein the group of computing devices is divided into a plurality of zones according to a predetermined condition, and wherein the selected computing device is located in one of the plurality of zones; and
a second managing server for managing a group of power supply units, for receiving the control request, and for controlling an identified power supply unit in the group of power supply units that exerts a power changing effect on the zone in which the selected computing device is located;

wherein the first managing server comprises:
- a first managing unit for generating a control request specifying the selected computing device as a control target, according to a power state of each of the computing devices;
- a first storing unit for storing correspondence information indicating a correspondence between each computing device and the plurality of zones, the correspondence information for each computing device indicating the zone in which the computing device is located; and
- a first converter for converting the control request into zone information identifying the zone in which the selected computing device is located, based on the correspondence information stored in the first storing unit; and wherein the second managing server comprises:
- a second storing unit for storing correspondence information indicating a correspondence between each zone and the group of power supply units, the correspondence information for each zone indicating the power supply unit that exerts a power changing effect on the zone;
- a second converter for converting the zone information provided by the first converter into information identifying the power supply unit in the group of power supply units that has a power changing effect on the zone identified by the zone information, based on the correspondence information stored in the second storing unit; and
- a second managing unit for controlling the identified power supply unit to change a power state of the selected computing device.

* * * * *